United States Patent [19]

Le Comte

[11] 4,031,378

[45] June 21, 1977

[54] METHOD AND APPARATUS FOR FAST MULTIPLICATION INCLUDING CONVERSION OF OPERAND FORMAT

[75] Inventor: Michel L. Le Comte, Longjumeau, France

[73] Assignee: Jeumont-Schneider, Puteaux, France

[22] Filed: June 26, 1975

[21] Appl. No.: 590,509

[30] Foreign Application Priority Data

June 28, 1974 France .............................. 74.22575

[52] U.S. Cl. ............................................. 235/164
[51] Int. Cl.² ......................................... G06F 7/52
[58] Field of Search ...................................... 235/164

[56] References Cited

UNITED STATES PATENTS

| | | | |
|---|---|---|---|
| 3,814,924 | 6/1974 | Tate .................................... | 235/164 |
| 3,831,012 | 8/1974 | Tate et al. .......................... | 235/164 |
| 3,885,141 | 5/1975 | Kieburtz ............................. | 235/164 |

Primary Examiner—David H. Malzahn
Attorney, Agent, or Firm—Bacon & Thomas

[57] ABSTRACT

A method of and apparatus for fast digital multiplication wherein the lowest-weight digits and the high-weight digits which are equal to zero and whose weight is greater than the first high-weight digit equal to 1 are removed. The apparatus and method may be utilized in digital frequency filters.

22 Claims, 4 Drawing Figures

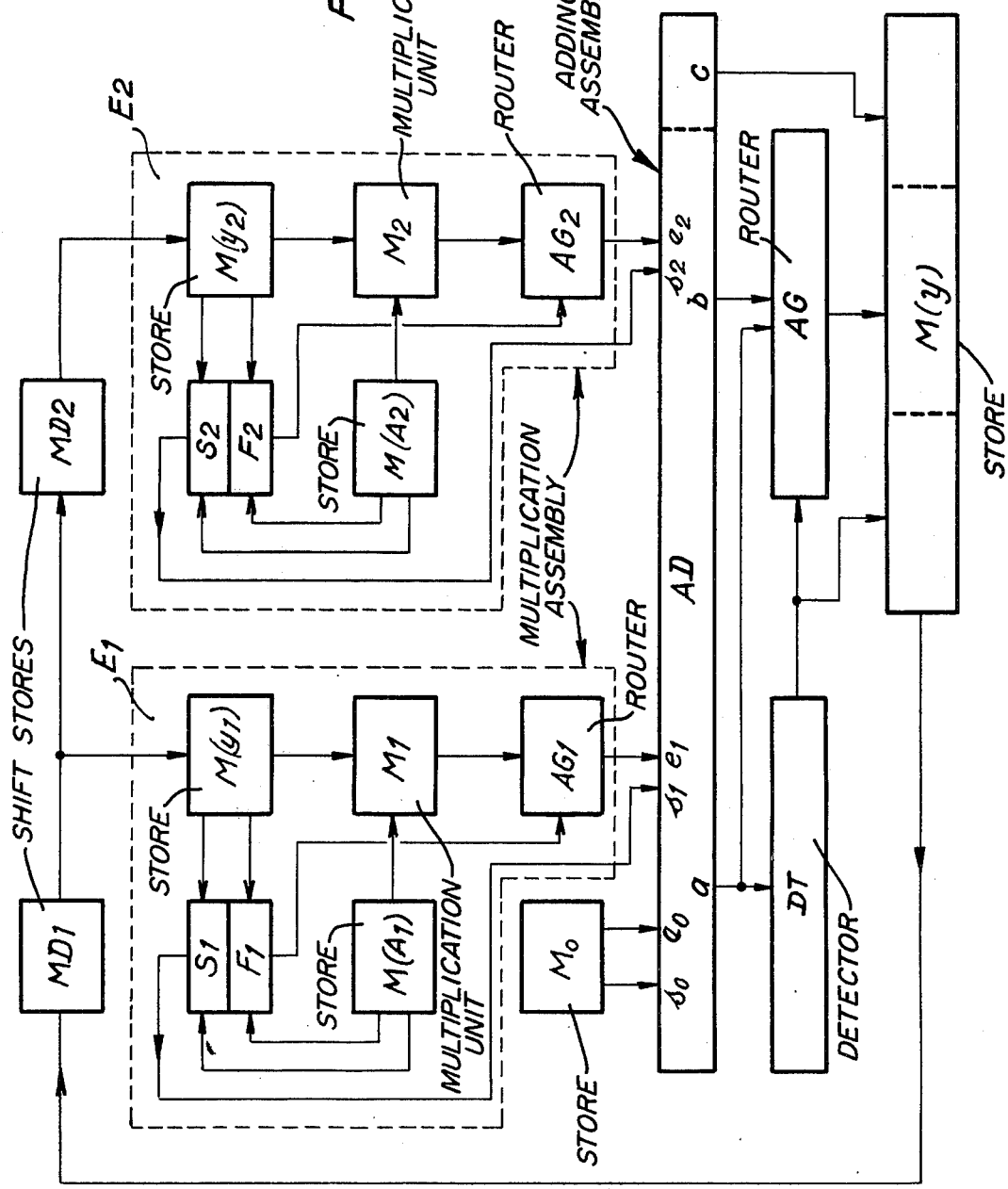

METHOD AND APPARATUS FOR FAST MULTIPLICATION INCLUDING CONVERSION OF OPERAND FORMAT

BACKGROUND OF THE INVENTION

1. Field of the Invention

This invention relates to a fast digital multiplier adapted to multiply two binary numbers together. The invention also relates to digital adder-multipliers which can calculate functions of the kind $y_o = A_1 \cdot y_1 + A_2 \cdot y_2 + \ldots + A_i \cdot y_i + \ldots + A_n \cdot y_n$, formed by the sum of $n$ products of two numbers $A_i$ and $y_i$, $i$ being a whole number between 1 and $n$. The invention also relates to digital filters comprising such adder-multipliers.

2. Description of the Prior Art

The number of digits or bits in a binary number may of course be very considerable and the time taken for a multiplication operation in known multiplier circuits is greater in proportion as the number of digits or bits of the values to be multiplied together is higher. Also, if high accuracy is required the values must have a large number of digits. The known multiplier circuits therefore operate fairly slowly because of the large number of digits in the values.

SUMMARY OF THE INVENTION

It is an object of this invention to obviate the disadvantage and to provide a fast multiplier.

The basic idea of the invention is to provide a very considerable reduction in the number of bits in the values to be multiplied together yet to retain a satisfactory relative accuracy; accordingly, the least significant bits — i.e., of low weight — and the most significant bits — i.e., of high weight — which are equal to zero and whose weight is greater than the first digit of high weight equal to 1, are eliminated. Of course, an indication of how many insignificant bits or digits of the low-weight items have been eliminated from the new representation of the value must be given, so that the weight of the various digits can be known. Each value therefore presents in the form:

of a number with its sign, comprising the main significant digits of which the first has the highest weight and is other than zero, such number representing the amplitude of the value, and a number with its sign, indicating the weight of the new unit relatively to the original value. The sign indicates whether the weight of the new unit in the new form or representation is greater or less than the weight of the unit in the former representation. The number indicates the multiplying factor for changing from one unit to the other — i.e., the weight shift between the new unit and the former unit. In other words, the number and its sign are a proportional indication of the amplitude and shift direction needed to place the various digits of a value in the column representing their own weight. Such number will hereinafter be called the "shift number".

According to the invention, therefore, in a process for fast multiplication of two binary values each in the form of a number of digits, each of the two values is so converted as to be in a new form excluding all the high-weight zero digits whose weight is greater than the first high-weight 1 digit and some of the lowest-weight digits, so that after conversion each value is represented by a first amplitude number with its sign, such representation comprising the main significant digits of which the first, which now has the highest weight, is different from zero, and by a second shift number whose amplitude indicates the weight shift between the units of the original and new representations of the value and whose sign represents the direction of the shift, whereafter the amplitude numbers of the two values are multiplied in known manner whereas the shift numbers are added algebraically, the result of the latter multiplication then being shifted towards either the low weights or the high weights, in agreement with the information given by the algebraic sum of the shift number, to provide a result in normal representation or form of the multiplication of the original two values.

Clearly, the invention leads to much faster multiplication of two values when reduced accuracy can be tolerated; for instance, the invention makes it possible to reduce values containing 12 or 16 bits to 8 bits.

To carry out the method according to the invention, a fast digital multiplier of two binary values each having a number of bits or digits is distinguished in that it comprises provision for converting each of the two values into a first amplitude number with a sign, such number comprising the main significant digits, the first of which has the highest weight and is different from zero, and into a second shift number whose amplitude indicates the weight shift between the units of the value before and after conversion and whose sign indicates the direction of the latter weight shift, the system also having provision for multiplying the amplitude numbers of the two values, provision for algebraically adding the shift numbers of the two values, and provision for shifting the result of multiplying the two amplitude numbers towards either the low weights or high weights, in agreement with the information given by the algebraic sum of the shift numbers.

The provision for converting such a value to be multiplied can comprise a detector and a router each receiving such value simultaneously, the detector determining by comparison the weight of the first high-weight digit of the value which is other than zero and so controlling the router that at the output thereof such weight represents the highest weights of the converted value. For instance, if the router is designed to process values of a particular bit number of format, there is automatic removal of the lowest-weight digits, the number of low-weight digits which are removed being equal to the difference between the initial number of digits or bits of the value and the router format, less the shift arising from suppression of the high weights. Such a router can be embodied by a shift register or by a multiplexer. Similar considerations apply to the provision for shifting the result of the multiplication of the two amplitude numbers of the values.

This invention is of use more particularly in fast digital adder-multipliers serving to calculate functions of the type:

$$y_o = A_1 \cdot y_1 + A_2 \cdot y_2 + \ldots + A_i \cdot y_i + \ldots + A_n \cdot y_n$$

In known adder-multipliers of such kind the various products $A_i \cdot y_i$ are calculated simultaneously by $n$ separate multiplication circuits whereafter the $n$ results are added together in an $n$-input adder which outputs the required result $y_o$. This invention helps to speed up the operation of a known adder-multiplier of such kind, subject to the $n$ multipliers calculating the $A_i \cdot y_i$ products being of the kind hereinbefore described.

Also of course, such an adder-multiplier is appropriate more particularly but not exclusively for use in the construction of digital filters in which the signal filtering effect is produced by sampling of the signal at a particular frequency, whereafter some fractions of previous samples are added to an existing sample. Such digital filters are described e.g. in the paper "Recent Advances in the Synthesis of Comb Filters" (1957 I.R.E. Nat. Conv. Rec., pages 186 to 199) and in a paper entitled "Digital Filter Design Techniques in the Frequency Domain" by Charles M. RADER and Bernard GOLD (Proceedings of the I.E.E.E. February 1967). Digital filters of this kind are very useful, particularly in radar and information transmission techniques, e.g. in telephony.

The known digital filters have basically the same design as the adder-multipliers referred to, with the addition, however, that their output is looped to an input of each separate multiplication circuit by delay facilities, such as shift stores, for the various values $y_1, y_2, \ldots y_n$ are the values of $y_o$ at the instant of time $-T, -2T, \ldots -nT$, respectively, T denoting the sampling period of the signal to be filtered. Consequently, it is sufficient to provide common conversion means, which are disposed in the loop, for all the values $y_o, y_1 \ldots, y_n$. Associated with the values $A_1, A_2 \ldots A_n$ are conversion means similar to those provided in the adder-multipliers according to the invention.

BRIEF DESCRIPTION OF THE DRAWINGS

The figures of the accompanying drawings will show how the invention can be carried into effect. In the drawings:

FIG. 4 shows a digital frequency filter according to the invention.

DETAILED DESCRIPTION OF THE PREFERRED EMBODIMENTS

Like references denote like elements throughout the drawings.

Figure 1:
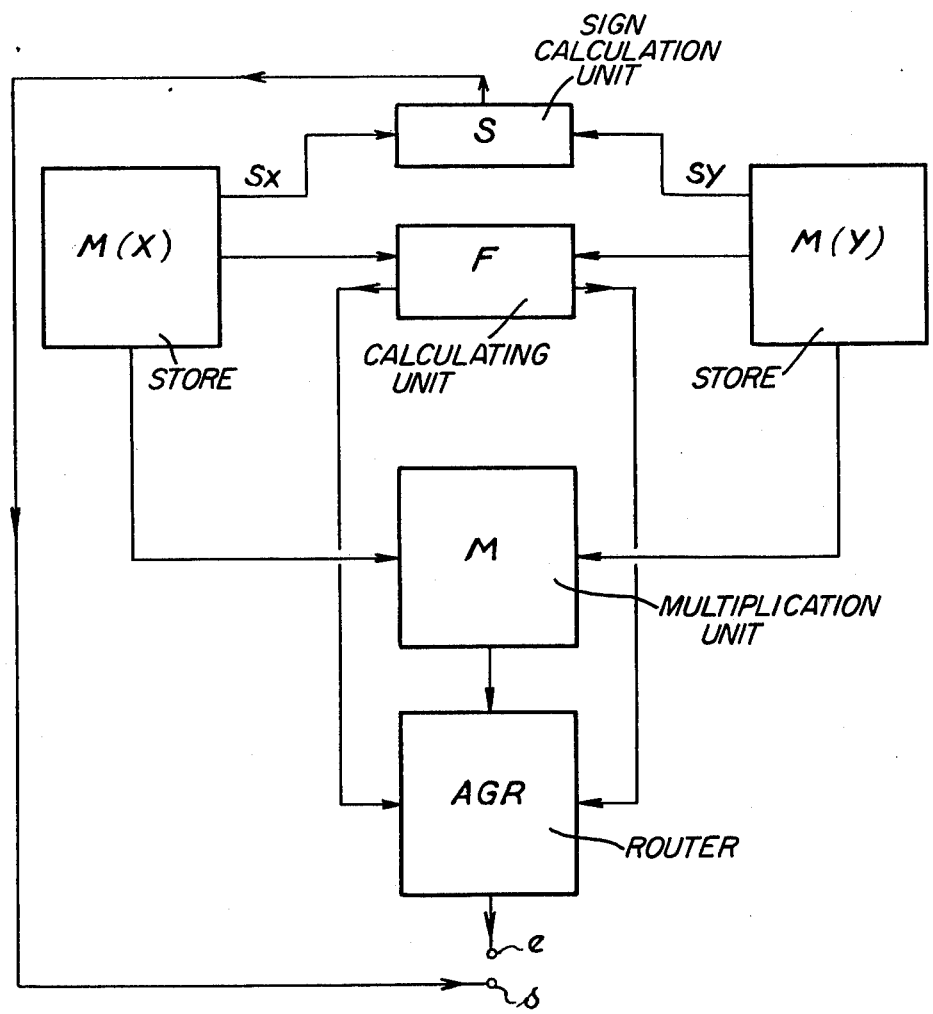
FIG. 1 is a block schematic view of a multiplier according to the invention.

The multiplier according to the invention which is shown in FIG. 1 comprises a store M (X) and a store M (Y) storing the values X and Y respectively which it is required to multiply together. Each such value takes the form of a first number with its sign, representing the amplitude of the corresponding value, and a second number with its sign, indicating the shift experienced by the value. A description will be given hereinafter with reference to FIG. 2 of how the values X and Y can be converted so as to be represented by an amplitude number and by a shift number.

The multiplier of FIG. 1 also has a multiplication unit M which can be of any known kind and which has applied to its multiplicand and multiplier inputs the amplitude numbers of the values X and Y respectively from the stores M (X) and M (Y). The multiplication unit M therefore outputs the product of the two amplitude numbers, the product going to a router A G R.

The multiplier of FIG. 1 also has a sign calculation unit S which receives signs Sx and Sy respectively of the values X and Y respectively from the stores M (X) and M (Y) respectively. The sign arising from multiplication of the values X and Y is output by unit S at a terminal s.

The stores M (X) and M (Y) also supply a calculating unit F with the shift numbers and their signs of the values X and Y. The two shift numbers are added algebraically in unit F and the addition results indicate by its amplitude the resulting shift and by its sign the direction of the shift. The router A G R receives the sum and its sign and shifts the product X·Y coming from the multiplication unit M in the direction indicated by the sign and by the number of bits or digits indicated by such sum. Consequently, the timed product of the values X and Y appears at router output e.

The system shown in FIG. 1 is therefore a means for multiplying the values X and Y in their simplified form (amplitude numbers), so that multiplication is speeded up, yet outputs the correct results of the calculated products with some loss of accuracy. There is therefore a floating-point multiplication of the values X and Y.

Figure 2:
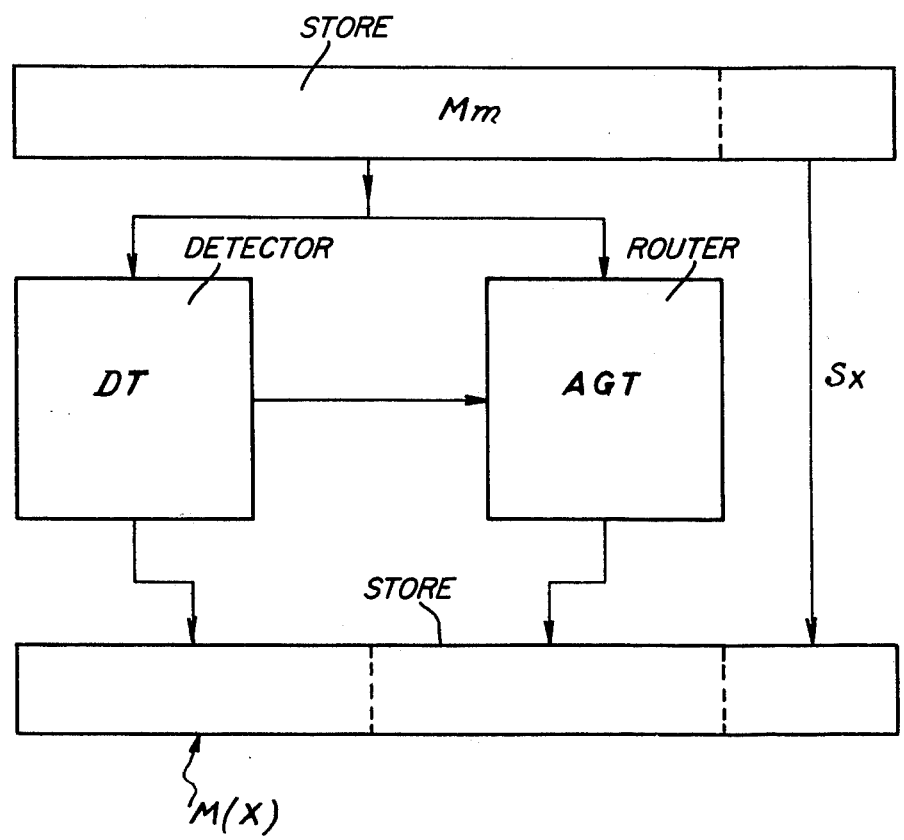
FIG. 2 is a block schematic view of the provision according to the invention for converting the values which it is required to multiply together.

Conversion of each of the two values X and Y into two numbers, viz. an amplitude number and a shift number as hereinbefore defined, can be provided by means of the system shown in FIG. 2 and comprising a detector DT and a router A G T. The values to be converted and their signs are stored in a store $M_m$, whereas the converted values — i.e., the amplitude and shift numbers and their signs — are stored once obtained in the store M (X) or M (Y) for further use.

The amplitude of a value to be convered, e.g. X, stored in the store $M_m$ is applied to the detector DT and router A G T simultaneously whereas the sign of the corresponding value is transferred directly to the store M (X). The detector DT determines by comparison the highest-weight bit of the value X which is different from O and transmits to the router A G T an address or shift number corresponding to the weight of such bit. The value X is shifted in the router A G T in accordance with such address, so that the amplitude number arises. The detector DT and router A G T then transmit the shift number and amplitude number respectively to the store M (X) which already contains the sign of X.

If the maximum number of bits which the router A G T can give the numbers it processes is less than the number of bits making up each number coming from the store $M_m$, there is automatic elimination of the lowest-weight bits. Also, assuming either that the numbers are integers or that they have a decimal point but are greater than 1, the shift is always in the same direction and so the sign of the shift number is of no importance.

Figure 3:
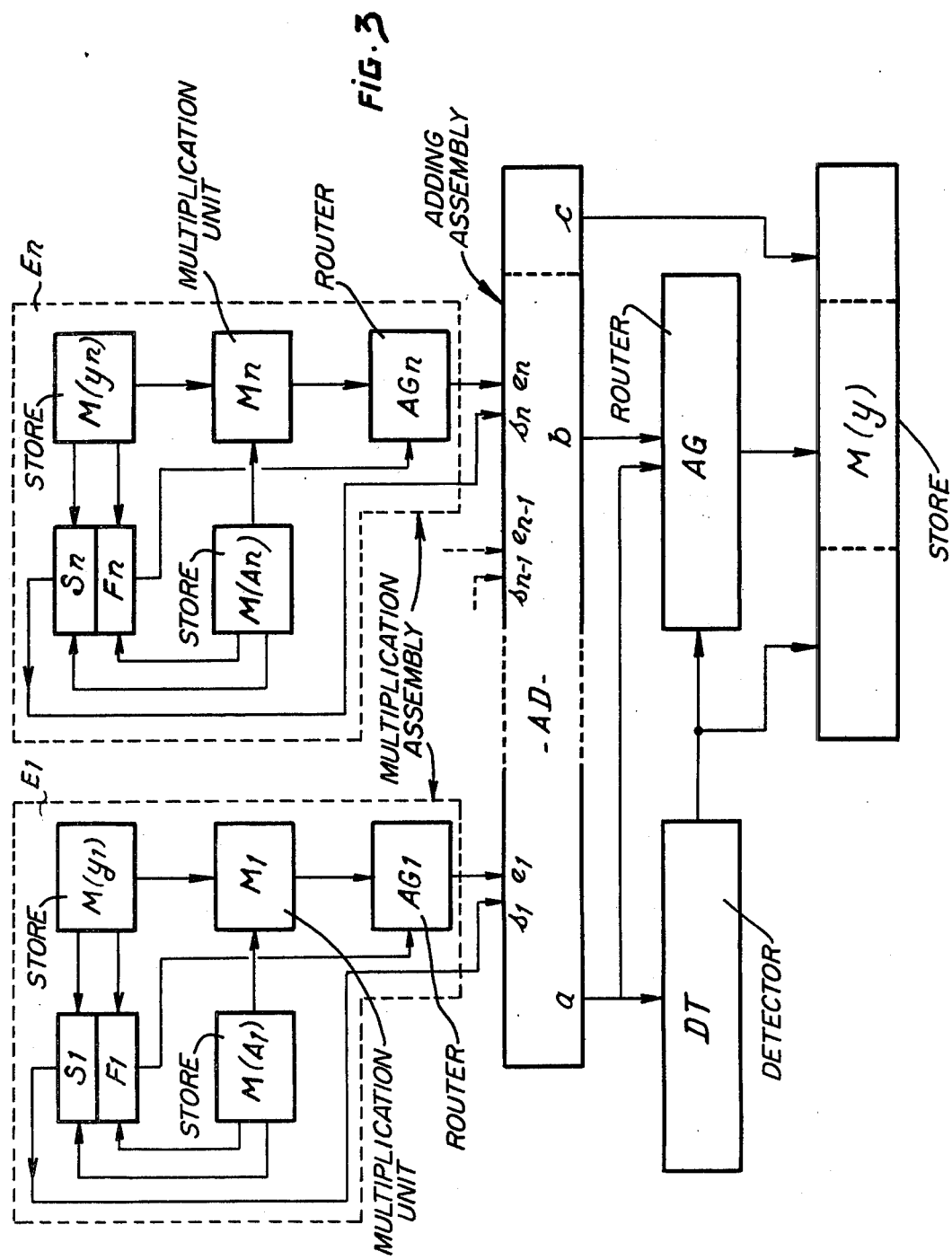
FIG. 3 is an overall block schematic view of an adder-multiplier according to the invention.

FIG. 3 shows a possible construction of an adder-multiplier according to the invention. The same comprises: an adding assembly AD having n signal input groups $e_1$ to $e_n$, one sign input $s_1$ to $s_n$ being associated with each group $e_1$ to $e_n$; and n identical multiplication assemblies $E_1$ to $E_n$. The groups $e_1$ to $e_n$ receive the output signals of the assemblies $E_1$ to $E_n$ respectively, the signs of the latter output signals being applied to the inputs $s_1$ to $s_n$ respectively.

Consequently, if it is required to obtain a function of the kind:

$$y_o = A_1 \cdot y_1 + A_2 \cdot y_2 + \ldots A_i \cdot y_i + \ldots A_n \cdot y_n,$$

the inputs $e_1$ and $s_1$ receive the amplitude and sign respectively of the product $A_1 \cdot y_1$, the inputs $e_2$ and $s_2$ receive the amplitude and sign respectively of the product $A_2 \cdot y_2$ and so on, and the inputs $e_n$ and $s_n$ receive the amplitude and sign respectively of the product $A_n \cdot y_n$.

Since all the multiplication assemblies $E_1$ to $E_n$ are identical and of similar construction to the multiplier shown in FIG. 1, only a single such assembly will be described, e.g. the assembly of rank $i$.

Each multiplication assembly $E_i$ has a store M ($y_i$) and a store M ($A_i$) storing the values $A_i$ and $y_i$ respectively. The latter values are presented in the form hereinbefore described — i.e., each such value comprises a first number with its sign, representing the amplitude of the value, and a second number with its sign, indicating the shift. The values $A_i$ and $y_i$ have been entered in the stores M ($y_i$) and M ($A_i$) e.g. through the agency of the system shown in FIG. 2.

The multiplication assembly $E_i$ has a multiplication unit $M_i$ receiving the number representing the amplitude of $y_i$ at its multiplicand inputs and the number representing the amplitude $A_i$ at its multiplier inputs. The unit $M_i$ therefore outputs the result of the products of the two numbers $y_i$ and $A_i$.

The multiplication units $M_i$ and $M_n$ can in known manner be embodied by elementary multiplication circuits enabling a $p$-digit multiplicand to be multiplied by a $q$-digit multiplier and making it possible to add to the result the value of a number which is applied to inputs known as "constant" inputs. Since the numbers $p$ and $q$ are fixed and therefore limited, grouping a number of multiplication circuits of such a kind is a means of increasing the number of bits of the inputs until it becomes possible for all the bits of the multiplicand and multiplier to be applied to the respective inputs of the group. The multiplicand and multiplier are therefore subdivided into respective blocks or portions of $p$ and $q$ digits, each such portion being applied to a number of elementary multiplication circuits. Each such circuit outputs a partial result of which the unit is the product of those units of the multiplicand portion and multiplier portion which are applied at the input. The various partial results are added together with regard to their respective weights. To this end, each of the partial products is applied to the constant inputs of another elementary multiplier whose output digit weight is equal to the digit weight of the number applied to the input of the constant. Each elementary multiplication circuit therefore multiplies together the two numbers applied to the multiplicand and multiplier inputs and adds to the result the value of the number applied to the constant input. Multiplications and additions therefore proceed simultaneously.

Each multiplication assembly $E_i$ comprises a sign-calculating unit $s_i$ for product amplitude, such unit receiving from the stores M ($y_i$) and M ($A_i$) the respective signs for the amplitudes of $y_i$ and $A_i$.

A calculating unit $F_i$ receives from the store M ($y_i$) and M ($A_i$) the shift numbers of $y_i$ and $A_i$ respectively and summates them algebraically to obtain the resulting shift number and its sign.

Consequently, the sign, the shift number and the amplitude number of the product $A_i \cdot y_i$ appear at the outputs of $S_i$, $F_i$ and $M_i$ respectively.

The $n$ results of the multiplications must be added together through the agency of the assembly AD. The $n$ products must therefore be restored to a single unit — i.e., the formats must be uniform. Accordingly, each assembly $E_i$ has a router A G$i$ for shifting each product $A_i \cdot y_i$ in the direction indicated by the sign of its shift number and with a shift amplitude equal to the latter number. The routers A G$i$ have their input connected to the output of the corresponding multiplication unit $M_i$ and their output (which forms the output of the corresponding assembly $E_i$) connected to the associated input $e_i$ of the adding assembly AD. The routers A G$i$ also have a control input connected to the output of the corresponding calculating unit $F_i$. Consequently, each router A G$i$ can apply to the assembly AD, in correspondence with its weight, each of the digits of the product it receives from the associated unit $M_i$.

Each router A G$i$ can take the form of a shift register which can shift the bits of the product applied to it in the direction and by an amount indicated by the shift number of such product. The router can also take the form of a multiplexing circuit enabling each input of a group of inputs $e_i$ of the adding assembly AD to select from the bits of the product applied to the group the bit corresponding to the weight of the particular input concerned. In this case the various multiplexer outputs to which the bits of the products $A_i \cdot y_i$ are routed can be fixedly connected to the inputs of the corresponding input groups $e_i$ of the assembly AD. Of course, routing within the multiplexer is also controlled by the corresponding shift number; for instance, a shift number of zero causes the lowest-weight digit of the output of the multiplication unit $M_i$ to be applied to the unit input of the input group $e_i$, all the other digits undergoing a similar shift. A shift number of $-1$ causes the second bit of the low weights of the output of the multiplication unit $M_i$ to be applied to the same unit input of the group $e_i$. A shift number of $+1$ causes a shift of the same amplitude but in the opposite direction.

The adding assembly AD therefore receives the various products $A_i \cdot y_i$, brought to the same format, at its various inputs and therefore adds the $n$ values together in the light of their signs and delivers at its outputs the product $y_o$ (outputs $a$ and $b$) and its sign (output $c$), the high-weight bits appearing at $a$ and the low-weight bits at $b$.

For some uses, such as the use of the value $y_o$ in circuits similar to those hereinbefore described, it may be advantageous to convert $y_o$, as described in respect of $A_i$ and $y_i$, into two numbers: a number representing the value of $y_o$ with its sign, and a number indicating the shift (and its sign) of $y_o$. Such conversion can be performed similarly to what is shown in FIG. 1.

For this purpose the high-weight digits or bits of $y_o$ are applied to a detector circuit DT determining which is the highest-weight bit which is different from zero. The detector circuit DT then compares the highest-weight digit of $y_o$ with zero; if the result of the comparison shows that there is a difference, the detector DT stops its comparison and transmits to a router AG and to a store M ($y$) an address or shift number denoting the weight of such bit. If the result of the comparison indicates that the highest weight bit is equal to zero, the detector circuit DT compares the digit of the next lowest weight with zero, and so on. If $k$ denotes the number of fixed-point digits and $h$ denotes the number of floating point digits, the comparison is proceeded with in respect of the highest weight $k - h$ bits.

The detector DT therefore indicates the weight of the highest weight bit of $y_o$ which is different from zero. If the detector finds no such weight, it delivers an address equal to the rank of the last digit analyzed plus 1.

In the router AG to which all the bits of $y_o$ are transmitted, $y_o$ undergoes a shift controlled by the address just calculated by the detector DT, so that the router AG delivers the amplitude number of $y_o$. The shift number, amplitude number and sign of $y_o$ are then stored in the store M (y).

As in the previous case the router AG can be a shift register or a multiplexer.

FIG. 4 shows how the adder-multiplier according to the invention can be used in the construction of a two-stage fast digital filter. The same comprises two assemblies $E_1$ and $E_2$ which are identical to the assemblies $E_i$ hereinbefore described and which are connected to the input groups $s_1, e_1$ and $S_2, e_2$ of an adding assembly AD having three input groups. The third input groups $s_o, e_o$ is connected to a store $M_o$ containing a value $x_o$. Downstream of the adding assembly AD there is the facility DT, AG and M (y).

The filter shown in FIG. 4 also comprises two shift stores MD1 and MD2 so devised that MD1 receives the data contained in M (y) and can transfer its own data both to M ($y_1$) and to MD2. The same can also transmit its data to M ($y_2$).

On the basis of amplitude signal samples $x_o$ reaching $M_o$ at a periodicity T, a filter of such a kind can calculate the function:

$$y_o = A_1 y_1 + A_2 y_2 + x_o,$$

$y_1$ and $y_2$ denoting the values of $y_o$ at the instant of time $-T$ and $-2T$ respectively if $y_o$ is calculated at the time 0, $A_1$ and $A_2$ being coefficients.

The values $y_1$ and $y_2$ appear at the output of the stores MD1 and MD2 respectively, the former receiving at its input the value $y_o$ from the store M (y). Each of the stores MD1 and MD2 performs a complete shift cycle in the time T.

As previously described, the coefficients $A_1$ and $A_2$ appear, in their converted form just described, at the output of the permanent stores M ($A_1$) and M ($A_2$) belonging to the assemblies $E_1$ and $E_2$ respectively; and on the one hand the values $y_1$ and $A_1$ and the values $y_2$ and $A_2$ are applied to the multiplicand and the multiplier inputs of their respective multiplication unit $M_1$, $M_2$. The signals output by the latter units are applied to the inputs of the two routers AG1 and AG2 whose routing is controlled by the shift number of each product $A_1 \cdot y_1$ and $A_2 \cdot y_2$ (through the agency of the calculator units $F_1$ and $F_2$). The three values $x_o$, $A_1 \cdot y_1$ and $A_2 \cdot y_2$ are added together in the adding assembly AD, with due regard to their sign. The result $y_o$ is then analyzed by the detector DT determining the rank of the highest-weight bit different from zero and hence determining the shift to be applied. The value $y_o$ then goes through the routing circuit AG, which is controlled by the value of the previously determined shift and whose outputs are applied via the store M (y) to the input of the shift store MD1 outputting the value $y_1$. The value of the shift is present in the shift store MD1.

So that the operation of the digital filter shown in FIG. 3 may be understood readily, the following assumptions will be made:

a. at the output of AD the value $y_o$ comprises 16 value bits and 1 sign bit, in which event a requirement for accuracy to 8 digits or bits calls for a maximum shift of 8 bits;

b. at the output of $M_o$ the value $x_o$ contains 10 bits plus 1 sign bit;

c. at the output of the stores MD1 and MD2 the values $y_1$ and $y_2$ each comprise 12 bits — i.e., 8 bits for the amplitude number, 1 bit for the sign and 3 bits for the shift number.

The direction of the shift is assumed always to be the same, $A_1$ is less than 2 and $A_2$ is between 0.5 and 1.

The eight digits of $y_1$ and $y_2$, coming from MD1 and MD2 respectively through M ($y_1$) and M ($y_2$), are applied to the associated multiplication unit $M_1$ and $M_2$ which also receives $A_1$ or $A_2$, the same also taking the form of an eight-bit word or less if accuracy remains satisfactory.

If $A_2$ can be quantized and written in the form:

$$A_2 = 1 - \tfrac{1}{2}m$$

where $m$ is a positive integer $\geq 1$, the assembly $E_2$ can be simplified and the multiplication of $y_2$ by $A_2$ can become a subtraction:

$$A_2 \cdot y_2 = y_2 - (y_2/2m)$$

For instance, if $A_2 = 0.984$, it is possible to write:

$$A_2 = 1 - (1/2^6) = 1 - 1/64,$$

so that $A_2 \cdot y_2 = y_2 - y_2/64$. This comes to subtracting from $y_2$, $y_2$ itself after a shift of $m$ times towards low weights (in the example $m = 6$) and therefore after having been divided by $2^m = 2^6 = 64$.

Since $y_2$ is represented by 8 digits, there remain in this example only $8 - 6 = 2$ digits or bits, the first of which can be 0 (see hereinafter), to represent $y_2/64$; there is therefore a loss of low weights and a reduction of the latter number. A fraction smaller than $y_2/64$ is therefore subtracted from $y_2$, and the coefficient $A_2$ therefore acquires a value slightly closer to 1 than the theoretical value taken as an example.

The product $A_2 \cdot y_2$ therefore appears very rapidly, so that such product can be added after routing to the value $x_o$ which has been available since the beginning of the calculation.

Consequently, when the result of the multiplication of $A_1$ by $y_1$ appears at the output of $E_1$, $y_o$ can be found by adding such result to the result of the previous addition.

To simplify equipment, the routers AG1 and AG2 can perform five possible shifts, viz. 0 or 2 or 4 or 6 or 8 digits, quantized in 2-steps. The latter routers also make it possible for each of the bits at the inputs of the adder AD to be chosen as "one amongst five" bits of the outputs of the multiplication units $M_1$ and $M_2$.

Since the shifts are quantized by 2-bit groups, the higher-weight bit considered in floating point operation can be 0 if the next bit is a 1, for a further shift of 2 bits would eliminate such second bit. If the number is small (zero shift), there can of course be a number of zeros on the high-weight-digit side.

If the adder input groups $e_1$ and $e_2$ have e.g. 16 bits each, the routers AG1 and AG2 have 32 routing circuits each making a "one amongst five" selection. The adder AD outputs a 16-bit representation of the value $y_o$.

The 8 higher-weight bits of $y_o$ are applied to the detector DT, which outputs 3 address bits (shift number) to the router AG whose input receives $y_o$. The router AG makes a "one amongst five" selection, giving a shift which can vary from zero to 8 bits.

The 8 bits representing the value of $y_0$ at the output of the router AG, the sign bit of $y_0$ and the three shift bits are then placed in the shift store MD1.

In the embodiment shown in FIG. 4 the store M (y) may not exist physically, the 12 bits of $y_0$ possibly being introduced directly into the store MD1 from the output of detector DT, from the output of the router AG and from the sign output b of the adder AD.

It may be useful if the filter shown in FIG. 4 can accept numbers whose digit count (or format) is greater than the output format of the adder AD, as for instance, if in the example just given it is required to process numbers having 18 bits instead of 16.

There are no difficulties with the multiplication units $M_1$ and $M_2$ since the same operate on a floating point basis. It is sufficient to have available a shift of adequate amplitude — in the present case of $18 - 8 = 10$ bits — i.e., an extra 2-bit shift. In the adder AD which normally operates on a normal format, a residual 2-bit shift must be retained for the three numbers $x_0$, $A_1 \cdot y_1$ and $A_2 \cdot y_2$, so that 2 low-weight digits can be removed from the 18 bits or digits. For instance, in the case of numbers, e.g. $y_1$ and $y_2$, which exceed the format receivable by the adder AD (16 bits), the timing amplitude provided by the routers AG1 and AG2 is so chosen that such numbers have the receivable format — i.e., that the amplitude of such timing is less than the amplitude of the readjustment which should normally be made and that the lowest weight of the readjusted number corresponds not to the weight of the units but to a greater weight. For instance, and as seen in the foregoing example, in the case of 18-bit numbers a readjustment of 10 bits could normally be provided. Actually, they will be readjusted by only 8 bits and the lowest weight will be equal to a weight of $2^2 = 4$. Conversely, in the case numbers e.g. $x_0$, not exceeding the format receivable by the adder AD, a shift is made (by means of a router which is not shown) of an amplitude such that the lowest-weight bit of such number corresponds to the same weight as the lowest-weight bit of numbers exceeding the format. For instance, in the previous example $x_0$ would be given a 2-bit adjustment so that its lowest-weight bit takes the weight 4.

Of course, the two multiplication assemblies $E_1$ and $E_2$ can be coupled together so that the readjustments of the routers AG1 and AG2 are the same.

I claim:

1. A fast-multiplication digital system comprising at least one multiplier for multiplying two binary numbers each number comprised of a plurality of digits having differing significance and weights, each multiplier comprising means for converting each of the two binary numbers into a first amplitude number having a sign, each of said first amplitude numbers comprising the most significant digits of said binary number, the first digit being the most significant non-zero digit of said binary number, and into a second shift number having an amplitude indicative of a weight shift of the binary number before and after conversion to a predetermined format and a sign indicative of a direction of said weight shift, the system further comprising means for multiplying the first amplitude numbers of the two binary numbers and for producing a first resultant number corresponding to the multiplication of said first amplitude numbers, means for algebraically adding the second shift numbers of the two binary numbers and for producing a second resultant number corresponding to the addition of said second shift numbers, and means for shifting said first resultant number in response to said second resultant number.

2. A system according to claim 1, wherein said means for converting said binary numbers comprises a router means, and a detector means for determining by comparison the weight of the most significant non-zero digit of each of the binary numbers thereby controlling said router so that at the output thereof said weight represents the highest weight of the converted binary number, said detector means and said router means being adapted to receive said binary numbers simultaneously.

3. A system according to claim 1 characterized in that said means for converting each of the two binary numbers into a first amplitude number and said means for shifting said first resultant number comprises a shift register.

4. A system according to claim 1 characterized in that said means for converting each of the two binary numbers into a first amplitude number and said means for shifting said first resultant number comprises a multiplexer.

5. A system as defined in claim 1 where each multiplier multiplies two binary numbers $A_i$ and $y_i$ where $i$ denotes an integer between 1 and $n$, $n$ being the number of multipliers; and an adder means for performing a summation $$\sum_{i=1}^{i=n} A_i \cdot y_i$$

of the various products $A_i \cdot y_i$ produced by said multipliers.

6. A system as defined in claim 5 receiving signal samples of amplitude $x_0$ reaching said adder means at a fixed frequency of period T, said adder means producing an output value, $y_0$, given by:

$$y_0 = x_0 + \sum_{i=1}^{i=n} A_i \cdot y_i$$

in which the binary number $A_i$ are coefficients and the binary numbers $y_i$ are the values of $y_0$ at instants of time $t = -iT$, the system further comprising a plurality of delay means, the system output value $y_0$ being fed back in a loop to an input of each separate multiplier via one of said plurality of delay means, the system further comprising conversion means in said loop common to all the $y_i$ values.

7. A system according to claim 5 comprising additional means for shifting numbers introduced into the adder whereby in the case of numbers exceeding the adder format length the lowest weight of such excessive format length corresponds to a weight greater than the units weight of such numbers, whereas in the case of numbers not exceeding the format length the lowest weight corresponds to the same weight as the lowest weight of the numbers which do exceed the format length.

8. A system according to claim 7, characterized in that in the case of numbers representing the result of the multiplication available at the output of the multipliers, the additional shift means comprises a means for shifting such multipliers.

9. A system according to claim 7 wherein the additional shift means are coupled for providing the same shifts.

10. Apparatus for multiplying binary numbers each representable by a plurality of bits, said apparatus having at least one multiplier and each multiplier comprising:
  a. means for converting each of said binary numbers into a composite code, said converting means comprising means responsive to said binary numbers for detecting the most significant non-zero bit of said binary numbers,
  b. said converting means providing for each of said binary numbers a first coded output indicative of the magnitude of the most significant non-zero bit and at least some lower significant bits,
  c. said converting means providing for each of said binary numbers a second coded output indicative of the weight of said most significant non-zero bit, said composite code comprising said first and second coded outputs,
  d. multiplying means for multiplying together corresponding first coded outputs associated with one and another of said binary numbers to form a product code,
  e. adding means for adding together corresponding second coded outputs associated with said one and said another of said binary numbers to form a sum code, and
  f. shifting means for shifting said product code by a number of bits equal to said sum code to provide a resultant code output indicative of the product of one and another of said binary numbers.

11. Apparatus as recited in claim 10 wherein said second coded output comprises a sign bit indicative of the direction of shift associated with the weight of said most significant non-zero bit and said means for shifting comprises means for shifting towards higher and lower weights in accordance with the sign of said sum code.

12. Apparatus as recited in claim 10 wherein said means for shifting said product code comprises a shift register.

13. Apparatus as recited in claim 10 wherein said means for shifting said product code comprises a multiplexer.

14. Apparatus as recited in claim 10 comprising a plurality of said multipliers each having an output, and an additional adding means having multiple inputs, said multiple inputs being connected to outputs of said multipliers.

15. Apparatus as recited in claim 14 further comprising additional converting means and additional detecting means wherein said additional adding means provides an output binary number code to said additional converting means and to said additional detecting means for providing an additional composite code associated with said output binary number code from said additional adding means.

16. Apparatus as recited in claim 15 further comprising a plurality of storage means for storing binary numbers for feeding to said multiplying and adding means, and wherein first connecting means feed said additional composite code to a first shift register for connection to one of said storage means.

17. Apparatus as recited in claim 16 further comprising another shift register, wherein the output of said first shift register is fed to said other shift register for connection to another storage means, whereby said apparatus operates as a digital frequency filter.

18. Apparatus as recited in claim 16 wherein said converting means comprises first and second storage means for storing respective first and second binary representations corresponding to one and another of said binary numbers, and third and fourth storage means for storing composite code binary representations corresponding respectively to said composite codes of said one and another of said binary numbers.

19. Apparatus as recited in claim 18 wherein said converting means further comprises first router means for routing said most significant non-zero bit and at least some lower significant bits from said first storage means to said third storage means for said one binary number.

20. Apparatus as recited in claim 19 wherein said converting means further comprises second router means for routing said most significant non-zero bit and at least some lower significant bits from said second storage to said fourth storage means for said another binary number.

21. Apparatus as recited in claim 20 wherein said first and second router means comprise shift registers.

22. Apparatus as recited in claim 20 wherein said first and second router means comprise multiplexers.

* * * * *